(12) United States Patent
Nakao

(10) Patent No.: US 6,994,940 B2
(45) Date of Patent: Feb. 7, 2006

(54) PHASE SHIFT MASK, METHOD FOR FORMING PATTERN USING PHASE SHIFT MASK AND MANUFACTURING METHOD FOR ELECTRONIC DEVICE

(75) Inventor: Shuji Nakao, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 220 days.

(21) Appl. No.: 10/638,339

(22) Filed: Aug. 12, 2003

(65) Prior Publication Data

US 2004/0161677 A1    Aug. 19, 2004

(30) Foreign Application Priority Data

Feb. 18, 2003  (JP) ............................. 2003-039582

(51) Int. Cl.
*G01F 9/00* (2006.01)
(52) U.S. Cl. ......................................................... 430/5
(58) Field of Classification Search .................... 430/5, 430/311–313, 322–323
See application file for complete search history.

(56) References Cited

U.S. PATENT DOCUMENTS 6,251,546 B1   6/2001   Cirelli et al.

2002/0177054 A1 *  11/2002  Saitoh et al. .................. 430/22

FOREIGN PATENT DOCUMENTS

JP         10-293392        11/1998

OTHER PUBLICATIONS

"High Density lithography using attenuated phase shift mask and negative resist", S. Pau et al. Proceedings of SPIE vol. 4000 (2000), pp. 266-270.

* cited by examiner

*Primary Examiner*—S. Rosasco
(74) *Attorney, Agent, or Firm*—McDermott Will & Emery LLP

(57) ABSTRACT

A phase shift mask of the present invention has a half tone light blocking film formed on a substrate and having an aperture for exposing a portion of the surface of substrate. The phase of the exposure light that has been transmitted through half tone light blocking film differs from the phase of the exposure light that has been transmitted through aperture by 180°. The light transmission rate defined by the ratio of the light intensity of the exposure light that has been transmitted through half tone light blocking film to the light intensity of the exposure light that has been transmitted through aperture is not less than 15% to not more than 25%. The dimension of aperture is not less than 0.26 to not more than 0.45 according to the measurement wherein wavelength $\lambda$ of the exposure light/numerical aperture NA is set at 1.

10 Claims, 10 Drawing Sheets

IMAGE CD (nm)

MEF

DOF (μm)

PATTERN PITCH (nm)

PHASE SHIFT MASK, METHOD FOR FORMING PATTERN USING PHASE SHIFT MASK AND MANUFACTURING METHOD FOR ELECTRONIC DEVICE

BACKGROUND OF THE INVENTION

1. Field of the Invention

The present invention relates to a half tone-type phase shift mask, a method for forming a pattern using such a phase shift mask, and a manufacturing method for an electronic device.

2. Description of the Background Art

In recent years, increase in the integration and miniaturization of semiconductor integrated circuits have been notable. At the same time, miniaturization of circuit patterns formed on semiconductor substrates (hereinafter, simply referred to as wafers) has rapidly progressed.

Photolithographic technology, in particular, is widely recognized as a basic technology for pattern formation. Accordingly, a variety of developments and improvements have so far been carried out concerning photolithographic technology. However, miniaturization of patterns is continuing and demand for increase in pattern resolution is still growing.

Such photolithographic technology is a technology for transcribing a pattern on a photomask (original drawing) to a photoresist applied to a wafer and for patterning a lower layer film, which is subsequently etched, using the photoresist to which the pattern has been transcribed.

A development process is carried out on the photoresist at the time of the above described transcription of the photoresist, and a photoresist wherein the portion exposed to light is removed as a result of this development process is a positive type and a photoresist wherein the portion that has not been exposed to light is removed as a result of this development process is a negative type.

In general, the resolution limit R (nm) in a photolithographic technology using a scaling down exposure method is represented as:

$$R = k_1 \cdot \lambda / (NA)$$

Here, the wavelength (nm) of utilized light is denoted as $\lambda$, the numerical aperture of the projection optical system of the lenses is denoted as NA and a constant that depends on the condition for image formation and on the resist process is denoted as $k_1$.

As can be seen from the above formula, a method for reducing the values of $k_1$ and $\lambda$ and for increasing the value of NA can be considered as a means for achieving an increase in the resolution limit R, that is to say, for gaining a microscopic pattern. That is to say, the constant that depends on the resist process is reduced and the wavelength may be continuously shortened and NA may be continuously increased.

From among the above, the reduction of the wavelength of the light source presents particularly difficult technical challenges and it becomes necessary to increase NA while using the same wavelength. In the case where NA is continuously increased; however, the depth of focus $\delta$ ($\delta = k_2 \cdot \lambda / (NA)^2$) becomes shallow and a problem arises wherein the precision of the form and dimensions of the formed pattern deteriorate.

Therefore, research has been carried out to achieve the miniaturization of patterns by improving the photomask instead of the light source or the lenses. Recently, phase shift masks have attracted attention as photomasks that increase the degree of resolution of patterns.

A phase shift mask wherein effective dark portions are formed by combining the optimal dimensions of a translucent phase shift part and a transmission part in the configuration is disclosed as an example of the above described phase shift mask in Japanese Patent Laying-Open No. 10-293392.

In the case where a hole pattern is formed using a conventional phase shift mask, however, microscopic change in the dimensions of the mask is reflected as a great change in the dimensions of the resist pattern that is formed on the wafer, particularly when a pattern is formed having dimensions smaller than the wavelength of the exposure light. Therefore, a problem arises wherein the formation of a hole pattern having the desired dimensions becomes difficult. That is to say, there is a problem wherein advanced technology is required for the manufacture of a mask where mask costs become high because a mask pattern having a very small dimension error is required.

In addition, there is a problem with a pattern formed according to a conventional hole pattern formation method wherein the manufacturing yield of semiconductor integrated circuits is lowered due to lack of uniformity of dimensions or wherein the degree of integration is lowered when the intervals of pattern alignment are increased in order to avoid such lowering of the manufacturing yield.

In addition, there is a problem wherein a high precision mask, which is costly, becomes necessary in order to overcome the lack of uniformity in the pattern dimensions.

SUMMARY OF THE INVENTION

The present invention is made to solve the above described problems, and it is an object thereof to provide a phase shift mask capable of forming a pattern having excellent uniformity in dimension at low cost without reducing the degree of integration, a method for forming a pattern using this phase shift mask, and a method for manufacturing an electronic device.

A phase shift mask according to the present invention includes: a substrate made of a material transmitting exposure light; and a half tone light blocking film, formed on the substrate, having an aperture exposing a portion of the surface of the substrate. The phase of the exposure light transmitted through the half tone light blocking film differs from the phase of the exposure light transmitted through the aperture. The light transmission rate defined by the ratio of the light intensity of the exposure light transmitted through the half tone light blocking film to the light intensity of the exposure light transmitted through the aperture is not less than 15% to not more than 25%. The dimension of the aperture is not less than 0.26 to not more than 0.45 on the basis of the measurement that exposure light wavelength $\lambda$/numerical aperture NA is set at 1.

According to the phase shift mask of the present invention, the dimension of the aperture is not less than 0.26 to not more than 0.45 on the basis of the measurement that exposure light wavelength $\lambda$/numerical aperture NA is set at 1; therefore, fluctuation in the dimension of the pattern (MEF) formed on the photoresist can be reduced relative to the fluctuation in the dimension of the aperture.

In the case where the light transmission rate (I2/I1) is less than 15%, MEF becomes large. In addition, in the case where the light transmission rate (I2/I1) exceeds 25%, inspection for defects in the phase shift mask cannot be carried out. That is to say, in the case where the light transmission rate (I2/I1) is set at not less than 15% and the light transmission rate (I2/I1) is set at less than 25%, inspection for defects can be carried out after manufacture of a mask and it is possible to carry out transcription with a low MEF using this mask.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following the embodiments of the present invention are described with reference to the drawings.

Figure 1:
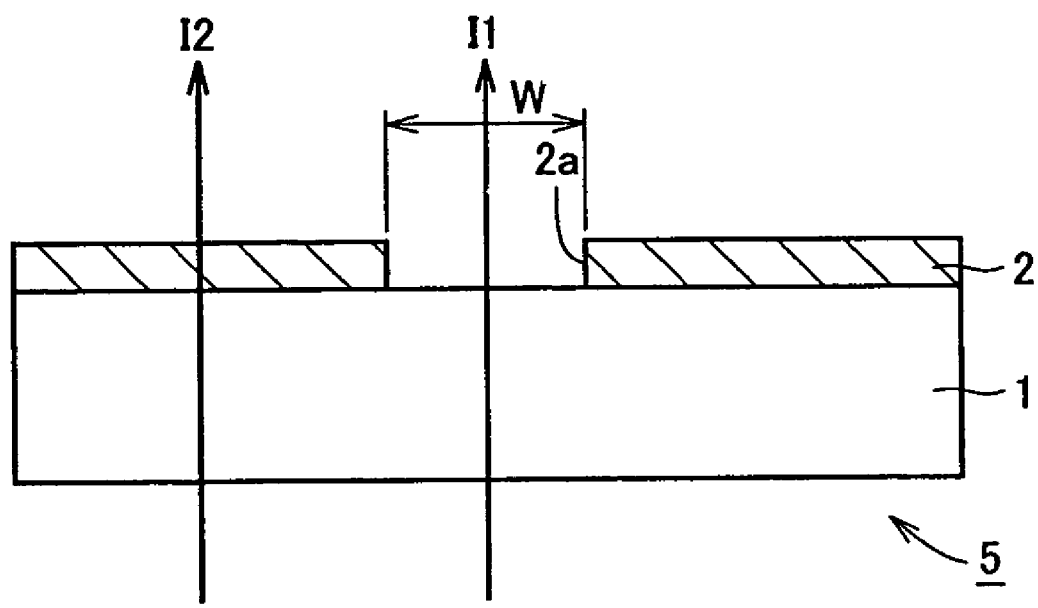
FIG. 1 is a cross sectional view schematically showing the configuration of a phase shift mask according to a first embodiment of the present invention.

With reference to FIG. 1, a phase shift mask 5 has a transparent substrate 1 and a half tone light blocking film 2. Transparent substrate 1 is made of a material that is transparent to exposure light so that the exposure light is transmitted through the substrate. Half tone light blocking film 2 is formed on transparent substrate 1 and has an aperture 2a that exposes a portion of the surface of transparent substrate 1.

Half tone light blocking film 2 is formed so that the exposure light that has been transmitted through the above described half tone light blocking film 2, is of a phase (for example a phase differing by 180°) differing from the phase of the exposure light that has been transmitted through aperture 2a. In addition, the light transmission rate defined by the ratio (I2/I1) of the light intensity I2 of the exposure light that has been transmitted through half tone light blocking film 2 to the light intensity I1 of the exposure light that has been transmitted through aperture 2a is not less than 15% to not more than 25%. In addition, dimension W of aperture 2a is not less than 0.26 to not more than 0.45 according to the measurement wherein exposure light wavelength ($\lambda$)/numerical aperture (NA) is set at 1.

Here, dimension W of aperture 2a indicates the length of one side of a rectangle in the case where aperture 2a in the plan view is in a rectangular form.

Next, a method for forming a pattern using the phase shift mask shown in FIG. 1 is described.

Figure 2:
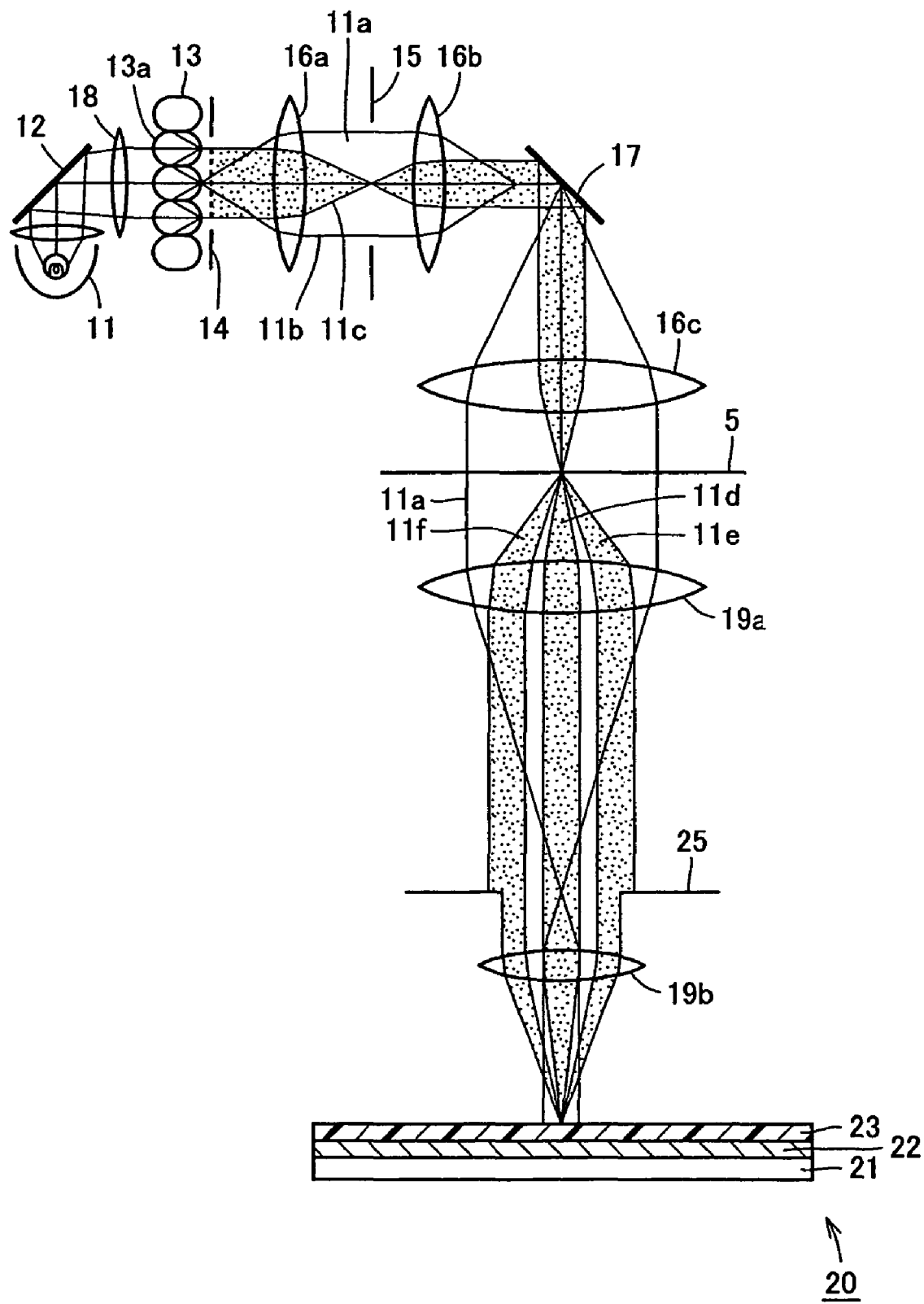
FIG. 2 is a view schematically showing the configuration of a projection aligner using a phase shift mask according to one embodiment of the present invention.

With reference to FIG. 2, this projection aligner scales down the pattern on phase shift mask 5 which is projected onto a photoresist 23 on the surface of a wafer 20. In addition, the projection aligner has an illumination optical system ranging from a light source 11 to the pattern of phase shift mask 5 and a projection optical system ranging from the pattern of phase shift mask 5 to wafer 20.

The illumination optical system has a mercury lamp 11, which is the light source, a reflection mirror 12, a condenser lens 18, a fly eye lens 13, a diaphragm 14, condenser lenses 16a, 16b, 16c, a blind diaphragm 15 and a reflection mirror 17. In addition, the projection optical system has projection lenses 19a, 19b and a diaphragm 25.

In the exposure operation thereof only i-line (wavelength of 365 nm), for example, of light 11a emitted from mercury lamp 11 is first reflected from reflection mirror 12 so that light 11a becomes light of a single wavelength. Next, light 11a passes through condenser lens 18 so as to enter each of fly eye lens components 13a of fly eye lens 13 and, after that, passes through diaphragm 14.

Here, light 11b indicates a light path created by one fly eye lens component 13a and light 11c indicates a light path created by fly eye lens 13.

Light 11a that has passed through diaphragm 14 passes through condenser lens 16a, blind diaphragm 15 and condenser lens 16b and is reflected from reflection mirror 17 at a predetermined angle.

Light 11a that has been reflected from reflection mirror 17 passes through condenser lens 16c and, after that, uniformly irradiates the entire surface of phase shift mask 5 on which a predetermined pattern is formed. After this, the image carried by light 11a is scaled down by a predetermined ratio by means of projection lenses 19a and 19b and photoresist 23 on the surface of wafer 20 is exposed by light 11a.

Figure 3:
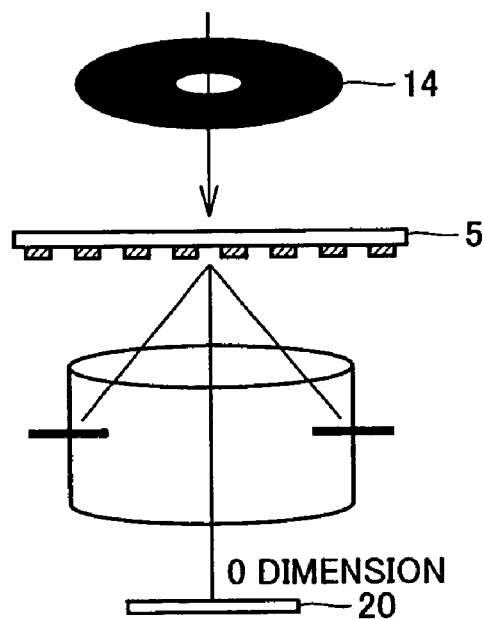
FIG. 3 is a view for describing a conventional illumination.

According to the present embodiment illumination of phase shift mask 5 is carried out by a modified illumination instead of by a conventional illumination. In the case of conventional illumination, exposure light is irradiated in the direction perpendicular to phase shift mask 5, as shown in FIG. 3, so that wafer 20 is exposed by three light fluxes of 0 dimensional and ±1 dimensional light. In the case where the pattern of phase shift mask 5 is miniaturized, however, the diffraction angle becomes large and ±1 dimensional light does not enter the lens in the perpendicular illumination and, therefore, there is a risk that the light may not resolve.

Figure 4:
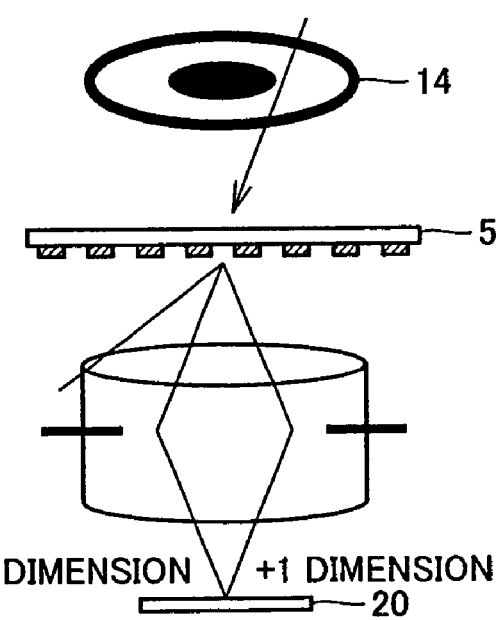
FIG. 4 is a view for describing a modified illumination.

Thus, illumination light flux is made to diagonally enter phase shift mask 5 by means of a modified illumination, as shown in FIG. 4. Thereby, exposure can be carried out using only two light fluxes of 0 dimensional and +1 or −1 dimensional light that have been diffracted by phase shift mask 5 so that a high resolution can be gained.

Figure 5:
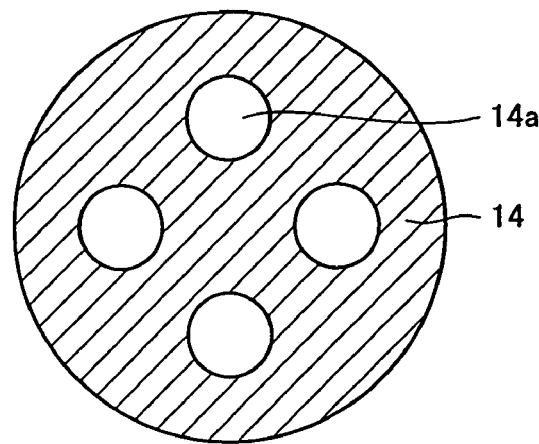
FIG. 5 is a plan view showing the configuration of a cross pole illumination diaphragm.
Figure 6:
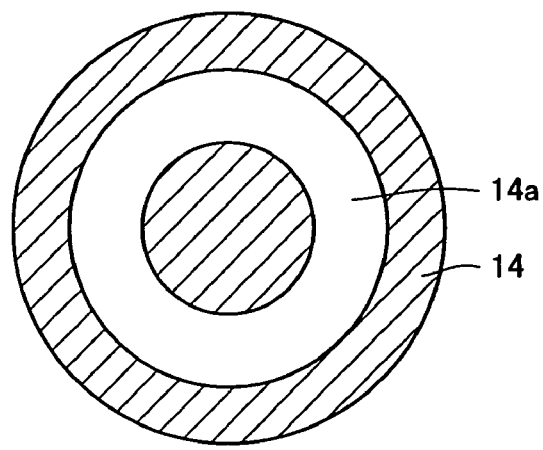
FIG. 6 is a plan view showing the configuration of an annular band illumination diaphragm.
Figure 7:
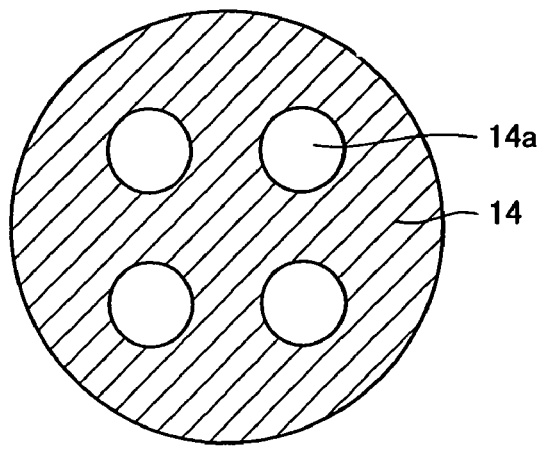
FIG. 7 is a plan view showing the configuration of a quadruple pole illumination diaphragm.

In such a modified illumination a cross pole illumination diaphragm having four transmission parts 14a, as shown in FIG. 5, an annular band illumination diaphragm having an annular transmission part 14a, as shown in FIG. 6, a quadruple pole illumination diaphragm having four transmission parts 14a and having a form gained by rotating the cross pole illumination by 45°, as shown in FIG. 7, may be used as diaphragm 14 of FIG. 2. Thereby, a cross pole illumination, an annular band illumination or a quadruple pole illumination can be implemented as a modified illumination.

Here, the formation of a highly dense pattern in an orthogonal grid according to X, Y coordinates within the wafer surface becomes possible in the case where a cross pole illumination is used. In addition, the formation of an all-purpose pattern having little dependence on the pattern design becomes possible in the case where an annular band illumination is used. In addition, the formation of a highly dense pattern, in an orthogonal grid according to X, Y coordinates within the wafer surface, that has been rotated by 45° relative to the pattern formed by means of a cross pole illumination becomes possible in the case where a quadruple pole illumination is used.

Figure 8:
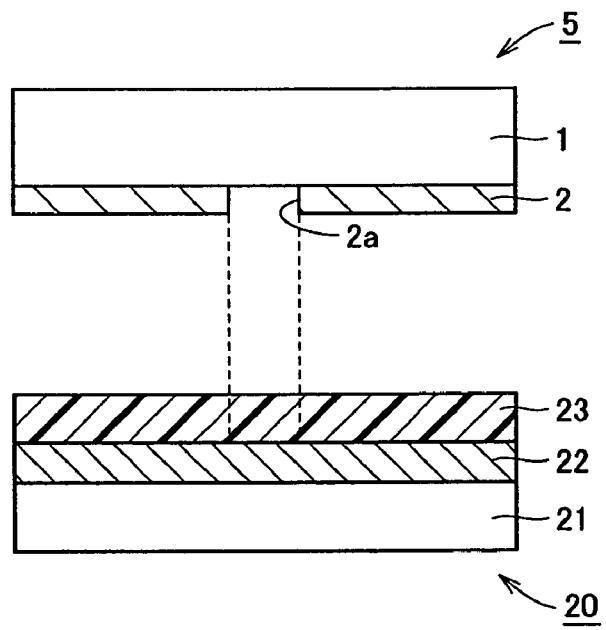
FIGS. 8 to 10 are schematic cross sectional views showing, in sequence, the steps of a method for forming a pattern using a phase shift mask according to one embodiment of the present invention and in the case where the photoresist is a negative type photoresist.
Figure 9:
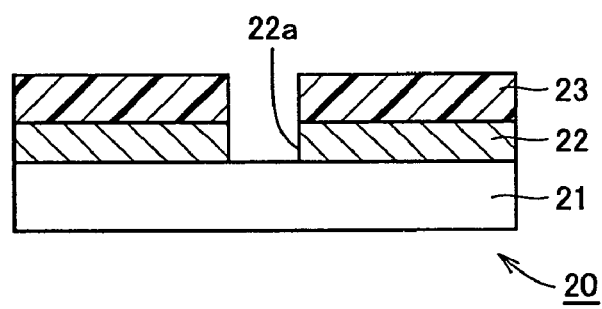
Figure 10:
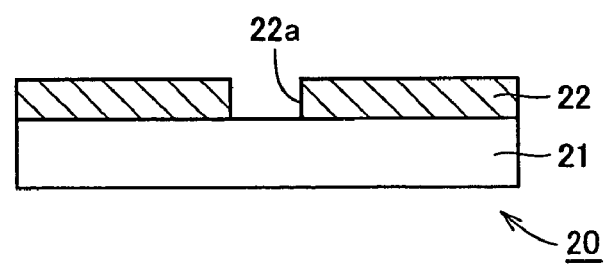

With reference to FIG. 8, photoresist 23 on the surface of wafer 20 is exposed by exposure light that has illuminated phase shift mask 5 by means of the above described modified illumination. Exposed photoresist 23 is patterned through development. In this development only the portion of photoresist 23 into which exposure light energy having a predetermined value or less has entered is removed in the case where photoresist 23 is a negative photoresist, as shown in FIG. 9, so that photoresist 23 is patterned. Lower layer film 22 is etched using the above patterned photoresist 23 as a mask, thereby a hole pattern 22a can be formed in this etched film 22. After this, photoresist 23 is removed by means of, for example, ashing and a semiconductor device wherein etched film 22 having microscopic hole pattern 22a is formed on semiconductor substrate 21, as shown in FIG. 10, can be manufactured.

Figure 11:
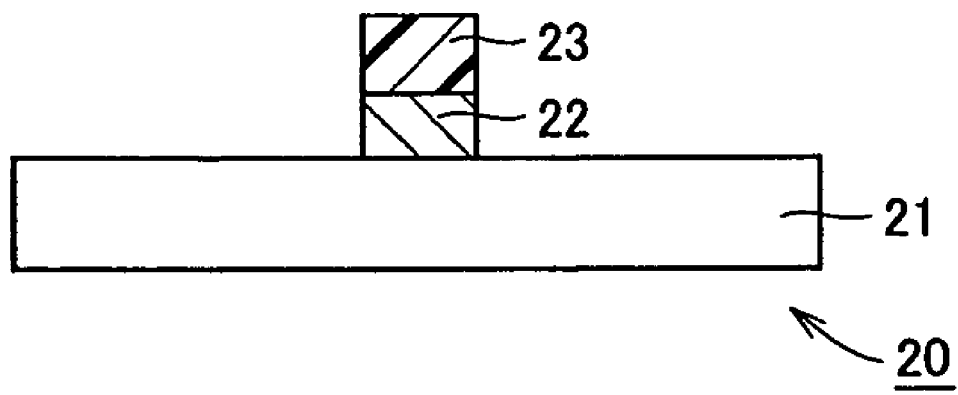
FIGS. 11 and 12 are schematic cross sectional views showing, in sequence, the steps of a method for forming a pattern using a phase shift mask according to one embodiment of the present invention and in the case where the photoresist is a positive type photoresist.
Figure 12:
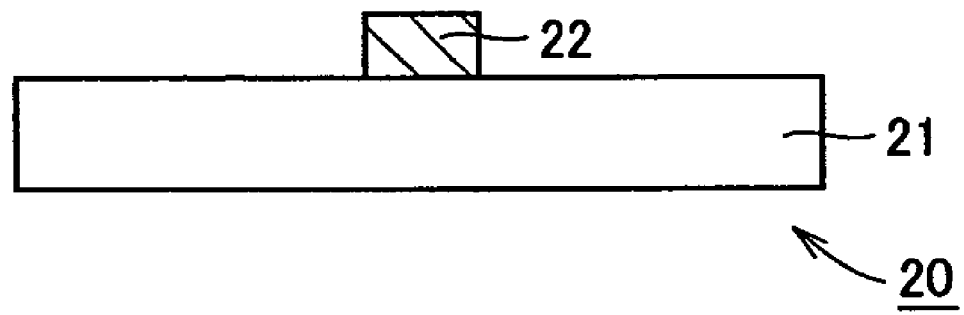

In addition, in the case that photoresist 23 is positive type photoresist in the above described development, only the portion of photoresist 23 into which exposure light energy having a predetermined value or higher has entered is removed, as shown in FIG. 11, so that photoresist 23 is patterned. Lower layer film 22 is etched using the above patterned photoresist 23 as a mask, thereby this etched film 22a can be formed into a dot pattern. After this, photoresist 23 is removed by means of, for example, ashing and a semiconductor device wherein etched film 22 in the form of a microscopic dot pattern, as shown in FIG. 12, is formed on semiconductor substrate 21 can be manufactured.

Here, in the both cases wherein photoresist 23 is either a negative type or positive type photoresist it is preferable for the exposure of photoresist 23 to be carried out with an amount of exposure light that is not less than ten times as large than and that is no greater than forty times as large as the amount of transient exposure light that inverts the solubility when photoresist 23 is exposed using an aperture pattern having a large dimension so that the diameter of the aperture is 10, or greater, on the basis of the measurement that wavelength λ/numerical aperture NA is set at 1. This is because it is difficult to gain an excellent resolution with an amount of exposure light in a range other than the above.

According to the phase shift mask of the present embodiment, the fluctuation in the dimension (mask error enhancement factor: MEF) of the pattern (hole pattern: FIG. 9, dot pattern: FIG. 11) formed on the photoresist can be reduced relative to the fluctuation in the dimension of the pattern (aperture 2a) formed on a mask. This is described in the following.

Figure 17:
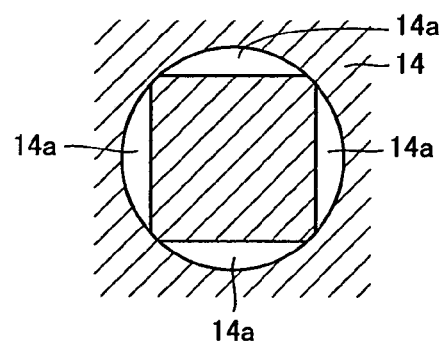
FIG. 17 is a plan view showing the configuration of a cross pole illumination diaphragm used in FIGS. 13 to 16.

The parameter in the respective graphs is the focus. As for the optical conditions, the wavelength of the exposure light is 248 nm, the numerical aperture NA is 0.80 and the illumination is a cross pole illumination ($\sigma_{in}/\sigma_{out}$=0.70/0.85). Diaphragm 14 for this cross pole illumination is in a form having four light transmission parts 14a, as shown in FIG. 17, and the transmission rate (I2/I1) of phase shift mask 5 is 20%.

Figure 13:
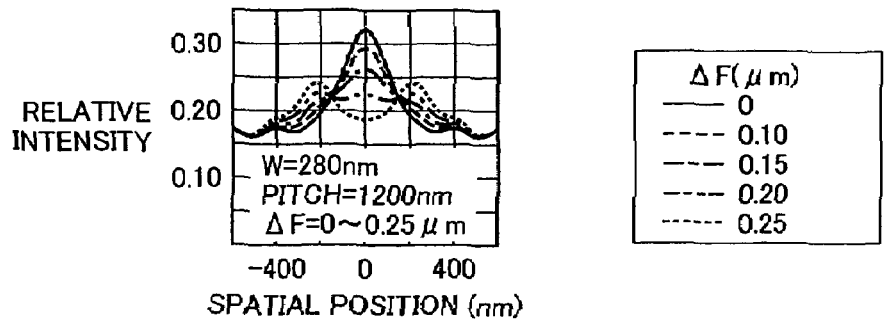
FIG. 13 is a graph showing an optical image formed by an image formation system in the case where the aperture of the phase shift mask shown in FIG. 1 has an isolated pattern wherein the dimension of the isolated pattern is W=280 nm.

In the case where dimension W of the aperture of phase shift mask 5 is large, the gained pattern approximately corresponds to that of the case of the formation of a pattern using a conventional half tone type phase shift mask. In this case, the intensity of the light that has been transmitted through aperture 2a, as shown in FIG. 13, becomes much greater than the intensity of the light that has been transmitted through half tone light blocking film 2 that has a phase relationship wherein the light that has been transmitted through aperture 2a is cancelled. Therefore, portions (portions wherein light intensity is high) that are brighter than the other regions are formed in the regions corresponding to aperture 2a.

Figure 14:
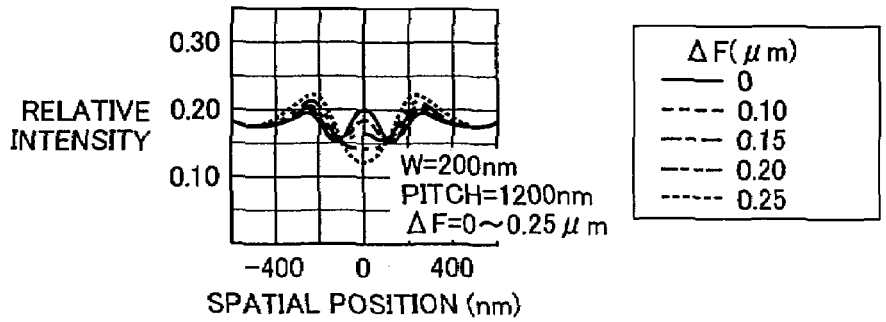
FIG. 14 is a graph showing an optical image formed by an image formation system in the case where the aperture of the phase shift mask shown in FIG. 1 has an isolated pattern wherein the dimension of the isolated pattern is W=200 nm.

When dimension W of aperture 2a is reduced the intensity of the light that has been transmitted through aperture 2a is reduced, as shown in FIG. 14, and cancellation by the light that has been transmitted through half tone light blocking film 2 is relatively increased. Thereby, an image is formed of light having an intensity that is approximately the same as the intensity of the light that has passed through half tone light blocking film 2. At this time, the contrast of the image is low and the formation of a pattern on the photoresist becomes difficult.

Figure 15:
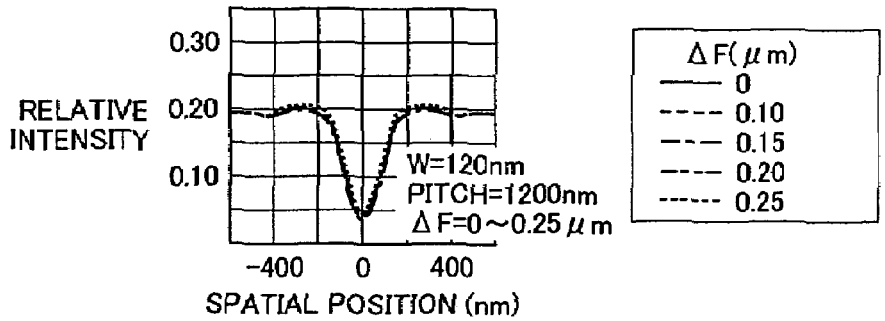
FIG. 15 is a graph showing an optical image formed by an image formation system in the case where the aperture of the phase shift mask shown in FIG. 1 has an isolated pattern wherein the dimension of the isolated pattern is W=120 nm.

When dimension W of aperture 2a is further reduced, the intensity of the light that has passed through aperture 2a and the intensity of the light that has passed through half tone light blocking film 2 become approximately equal. At this time the respective phases are in the relationship wherein they are of opposite phases (that is to say, the relationship wherein the phases differ by 180°) and, therefore, an image is formed in the region corresponding to aperture 2a as a point that is much darker than the other regions, as shown in FIG. 15. A hole pattern is formed in the photoresist in the case where such an image is formed on a negative type photoresist.

Figure 16:
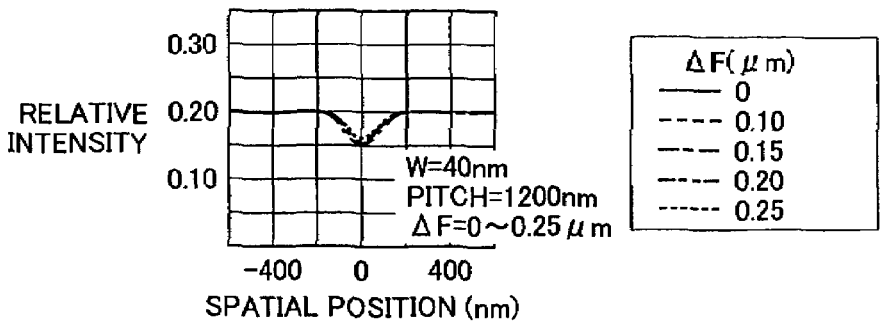
FIG. 16 is a graph showing an optical image formed by an image formation system in the case where the aperture of the phase shift mask shown in FIG. 1 has an isolated pattern wherein the dimension of the isolated pattern is W=40 nm.

When dimension W of aperture 2a is even further reduced, the intensity of light that is transmitted through aperture 2a in turn becomes smaller than the intensity of the light that is transmitted through half tone light blocking film 2, as shown in FIG. 16, and the effects of cancellation become small so that the dark point becomes less dark (becomes brighter).

When dimension W of aperture 2a is yet further reduced, the condition becomes substantially the same as if aperture 2a does not exist so that the contrast of the image disappears.

According to the above described optical conditions, it is understood that, as shown in FIG. 15, the dark point image exhibits excellent focus characteristics.

It is understood from the above description that the darkness of the dark point image formed in the region corresponding to aperture 2a is lessened (point image becomes brighter) even in the case where a specific dimension of aperture 2a, which is referred to as a border dimension, is increased or is reduced as compared with the border dimension.

Figure 18:
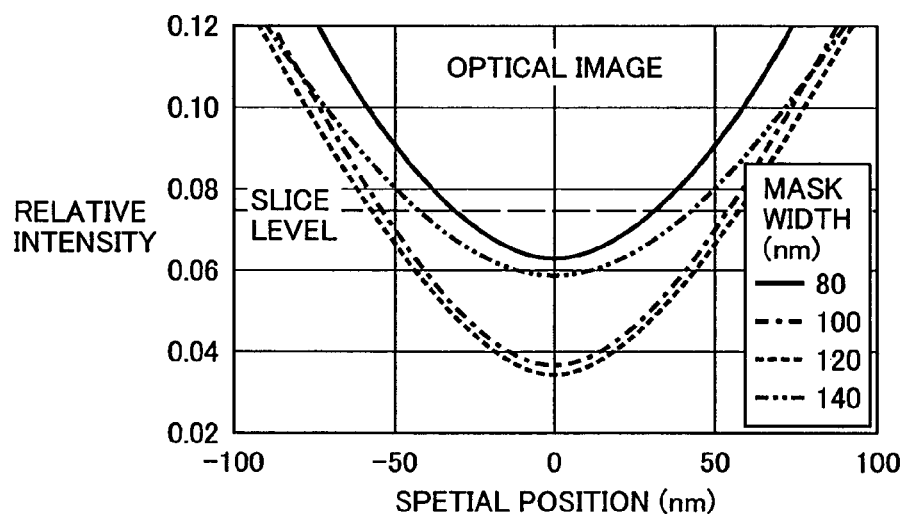
FIG. 18 is a graph showing a change of the optical image when dimension (mask width) W of the aperture of the phase shift mask shown in FIG. 1 is changed.

It is understood from the change in the optical image of FIG. 18 that the local minimum value of the intensity of the optical image becomes of the minimum when aperture 2a has a specific dimension W (mask width: 100 nm to 120 nm in this case) as described above and the local minimum value becomes greater than that in both cases wherein dimension W of aperture 2a is smaller (80 nm) than, and is greater (140 nm) than, the specific dimension.

When a photoresist is exposed with a constant amount of exposure light using mask patterns having differing dimensions W of aperture 2a, the dimension of the pattern that is formed in the photoresist approximately agrees with the dimension of the portion wherein the image becomes smaller than the slice level shown in the figure because the intensity of the slice level separates the state wherein the photoresist is soluble from the state wherein the photoresist is insoluble. That is to say, the dimension of the pattern formed on the photoresist is reduced in both cases wherein dimension W of aperture 2a is increased and is decreased. In particular, the dimension of the pattern formed on the photoresist does not depend on dimension W of the corresponding aperture 2a (differential is zero) in the case of dimension W of aperture 2a wherein the local minimum value of the intensity of the image becomes of the minimum.

Figure 19:
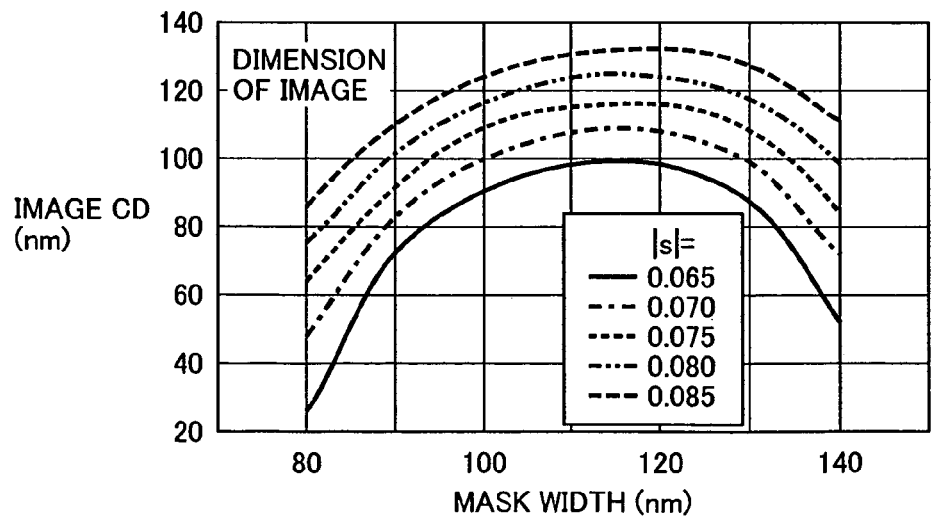
FIG. 19 is a graph wherein the dimensions of the image determined according to the slice level (dimensions of the pattern formed on the photoresist, image CD) are plotted as a function of the dimensions (mask width) of the aperture created in the mask.

As is clearly understood from FIG. 19, the dimension of the image has a local maximum at a specific dimension of aperture 2a. That is to say, in the case where the dimension of aperture 2a is set at the value where this local maximum is gained and pattern formation is carried out, the dimension of the image changes only slightly even when the dimension of aperture 2a fluctuates due to an error in the manufacture of the mask. Here, the parameter is the slice level (amount in inverse proportion to the amount of exposure light).

According to the state of the art of mask manufacturing technology at the present point in time the distribution (according to the value on the wafer calculated from the value of a×4 mask) of the dimension of aperture 2a due to manufacturing error has a dispersion range of 5 nm, or less. Therefore, it is understood that change in the dimension of the image becomes extremely small (1 nm to 2 nm or less) when the dimension of aperture 2a is set at a value where the local maximum value is gained even when the dimension of aperture 2a fluctuates by 5 nm due to manufacturing error.

Thus, the rate of fluctuation in the dimension of the image due to the fluctuation in the dimension of the pattern formed on the mask is referred to as the MEF (mask error enhancement factor) and is defined by the following equation.

$$MEF = \Delta CD \text{ wafer} / \Delta CD \text{ mask}$$

In this equation "$\Delta CD$ (critical dimension) wafer" is the fluctuation in the dimension of the image and "$\Delta CD$ mask" is a fluctuation in the dimension of the pattern formed in the mask as calculated on the wafer.

In the case where a microscopic hole pattern is formed according to a conventional method, the value of this MEF becomes great so that a slight fluctuation in the dimension of the pattern formed in the mask is reflected as a large fluctuation in the dimension of image and the dimension of the pattern, which is supposed to be a constant dimension, becomes widely dispersed. Thereby, it is clear that the yield and the performance of the device are negatively affected and a great problem arises concerning microscopic pattern formation.

In contrast to this, the dimension of aperture 2a is set in a range from not less than 80 nm to no greater than 140 nm so that the above described MEF can be reduced according to the present embodiment and, therefore, the formation of a pattern becomes possible when almost no effects from fluctuation in the dimension of aperture 2a are received so that an excellent manufacturing yield and excellent device performance can be gained.

Here, it is preferable for the dimension of aperture 2a to be in a range of from not less than 100 nm to no greater than 120 nm because change in the dimension of the image can be limited to a value as low as approximately 5 nm even when the dimension of aperture 2a fluctuates by 5 nm due to manufacturing error.

Though the above described dimension (in a range of from not less than 80 nm to no greater than 140 nm, preferably in a range of from not less than 100 nm to no greater than 120 nm) of aperture 2a is gained in the case where wavelength λ of the exposure light is 248 nm and numerical aperture NA is 0.80, an appropriate dimension of aperture 2a that can reduce the MEF exists in the case of other values of wavelength λ and of numerical aperture NA.

Therefore, dimension W0 of aperture 2a is found by means of the following equation in the case where measurement is carried out by setting wavelength λ/numerical aperture NA at 1 in order to find the above described appropriate dimension of the aperture.

dimension of aperture 2a: wavelength λ/numerical aperture NA=not less than 80 nm to not more than 140 nm:248/0.80=W0:1

The above equation shows that (248/0.80)×W0=not less than 80 nm to not more than 140 nm and, therefore, W0 is not less than 0.26 to not more than 0.45.

In addition, when dimension W1, which is measured by setting wavelength λ/numerical aperture NA at 1, is calculated using the preferable range (not less than 100 nm to not more than 120 nm) of the dimension of aperture 2a in the same manner as above, this dimension W1 is in a range of from not less than 0.32 to no greater than 0.39.

From the above description it becomes possible to reduce the MEF in the case where the dimension of aperture 2a is in a range of from not less than 0.26 to no greater than 0.45, preferably in a range of from not less than 0.32 to no greater than 0.39 when the measurement is carried out by setting wavelength λ/numerical aperture NA at 1 with respect to the respective values of wavelength λ and numerical aperture NA.

Here, in the case where the light transmission rate (I2/I1) is less than 15%, the degree of the curve shown in FIG. 19 increases so that the MEF becomes great. In addition, in the case that the light transmission rate (I2/I1) exceeds 25%, inspection of the phase shift mask cannot be carried out.

The mask dimension is constant at 120 nm and a microscopic adjustment (so-called optical proximity correction (OPC)) of the pattern dimension of the mask is not carried out in order to maintain the image dimension at a constant.

Figure 20A:
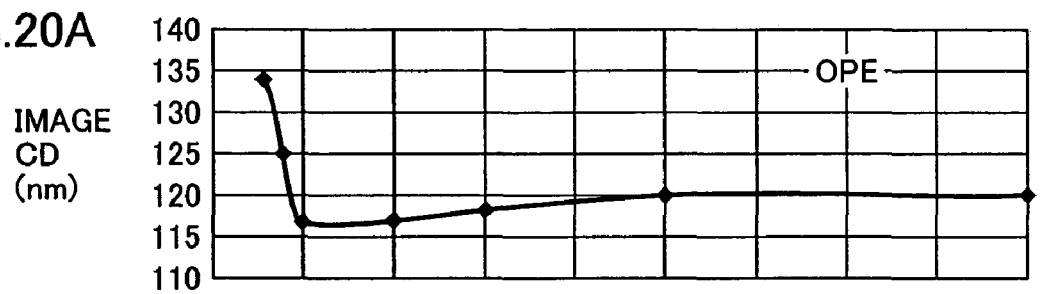
FIGS. 20A, 20B and 20C are graphs wherein respective changes in the image dimensions, in the MEF and in the depth of focus (DOF) are plotted when the pattern pitch is changed under the optical conditions where the versatility of the pattern is prioritized.
Figure 20B:
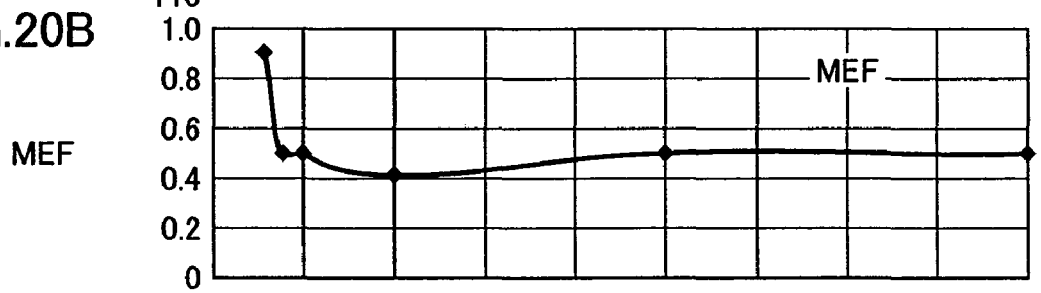
Figure 20C:
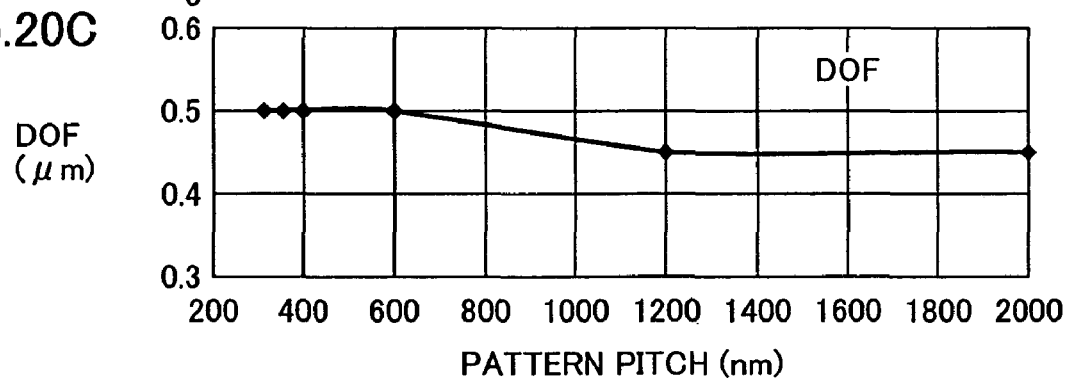

As can be seen from FIGS. 20A, 20B and 20C, the image dimension is large in the highly dense portion having a small pattern pitch because OPC is not carried out while the formation of patterns so that MEF<1 and DOF>0.45 becomes possible in a range from an isolated pattern having an extremely large pattern pitch to a pattern pitch of 300 nm.

Here, as for the optical conditions in FIGS. 20A, 20B and 20C, the wavelength of the exposure light is 248 nm, numerical aperture NA is 0.80 and the illumination is a cross pole illumination (modified illumination having an intensity lower than in FIGS. 13 to 16). In addition, the transmission rate (I2/I1) of phase shift mask 5 is 20%.

Furthermore, according to the method for forming a pattern using the phase shift mask of the present embodiment, the formation of an extremely dense hole pattern is possible by adjusting the pattern dimension of the mask and the slice level (amount of exposure light). The present inventors have researched change in the optical image of the pattern of storage node contacts, for example, of a DRAM (Dynamic Random Access Memory) according to the 0.1 $\mu$m rule in the case where the focus is varied. Here, the distance between the centers of adjacent holes is set at 200 nm.

As a result, an excellent optical image can be gained even in the case where the focus has shifted by ±0.3 $\mu$m from the optimal focus. Therefore, it is understood that a DOF greater than 0.6 $\mu$m can be gained even for an extremely dense pattern according to the method for forming a pattern using the phase shift mask of the present embodiment.

In addition, an isolated pattern and a highly dense pattern may both exist in the same phase shift mask of the present embodiment.

Figure 21:
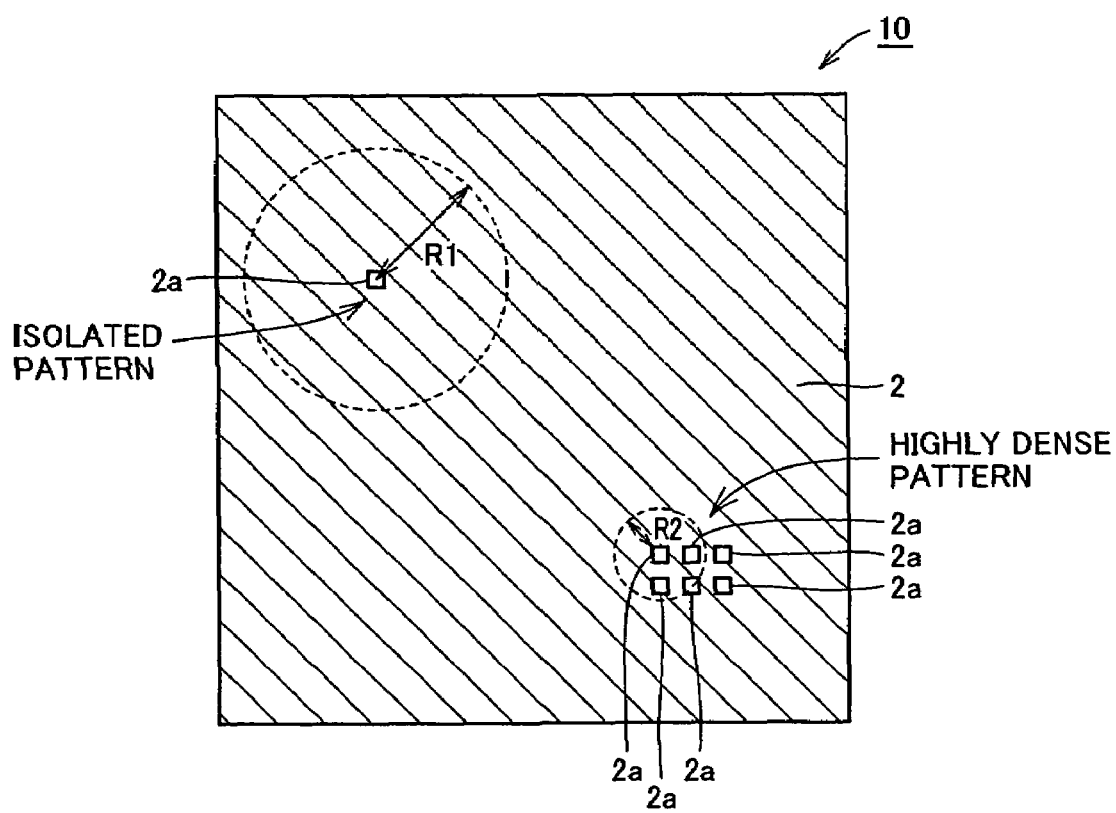
FIG. 21 is a schematic plan view showing the state wherein an isolated pattern and a highly dense pattern are both provided in a phase shift mask according to one embodiment of the present invention.

With reference to FIG. 21, the above described "isolated pattern" and "highly dense pattern" are described below. FIG. 21 is a schematic plan view showing the state wherein an isolated pattern and a highly dense pattern both exist in the same phase shift mask according to one embodiment of the present invention. With reference to FIG. 21, an isolated pattern indicates a pattern wherein no other patterns exist at a distance from the center of this isolated pattern 2a that is smaller than radius R1 of 3 in the case of measurement using numerical aperture NA/wavelength $\lambda$. In addition, a highly dense pattern made of a plurality of patterns indicates a pattern wherein another pattern 2a exists at a distance from the center of one pattern 2a that is smaller than radius R2 of 1 in the case of measurement using numerical aperture NA/wavelength $\lambda$.

Here, though a method for manufacturing a semiconductor device, for example, is described above as a method for forming a pattern, the present invention can be applied to a method for manufacturing an electronic device such as a liquid crystal display or a thin film magnetic head in addition to for a semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase shift mask comprising:
   a substrate made of a material transmitting exposure light; and
   a half tone light blocking film formed on said substrate and having an aperture exposing a portion of the surface of said substrate, wherein
   the phase of the exposure light transmitted through said halftone light blocking film differs from the phase of the exposure light transmitted through said aperture,
   the light transmission rate defined by the ratio of the light intensity of the exposure light transmitted through said half tone light blocking film to the light intensity of the exposure light transmitted through said aperture is not less than 15% to not more than 25%, and
   the dimension of said aperture is not less than 0.26 to not more than 0.45 on the basis of the measurement that exposure light wavelength $\lambda$/numerical aperture NA is set at 1.

2. A method for forming a pattern using a phase shift mask, wherein
   said phase shift mask according to claim 1 is illuminated by means of modified illumination.

3. The method for forming a pattern using a phase shift mask according to claim 2, wherein
   said modified illumination is a cross pole illumination.

4. The method for forming a pattern using a phase shift mask according to claim 2, wherein
   said modified illumination is an annular band illumination.

5. The method for forming a pattern using a phase shift mask according to claim 2, wherein
   said modified illumination is a quadruple pole illumination.

6. The method for forming a pattern using a phase shift mask according to claim 2, comprising the steps of:
   exposing a negative type photoresist applied to a wafer with exposure light with which said phase shift mask is illuminated; and
   developing said exposed photoresist.

7. The method for forming a pattern using a phase shift mask according to claim 6, wherein
   said photoresist is exposed with light wherein the diameter of the aperture is 10, or greater, on the basis of the measurement that wavelength $\lambda$/numerical aperture NA is set at 1 and wherein the amount of exposure light is not less than ten times to not more than forty times the amount of light for transition exposure that allows said photoresist to be exposed so that the solubility is inverted.

8. The method for forming a pattern using a phase shift mask according to claim 2, comprising the steps of:
   exposing a positive type photoresist applied to a wafer with exposure light with which said phase shift mask is illuminated; and
   developing said exposed photoresist.

9. The method for forming a pattern using a phase shift mask according to claim 8, wherein
   said photoresist is exposed with light wherein the diameter of the aperture is 10, or greater, on the basis of the measurement that wavelength $\lambda$/numerical aperture NA is set at 1 and wherein the amount of exposure light is not less than ten times to not more than forty times the amount of light for transition exposure that allows said photoresist to be exposed so that the solubility is inverted.

10. A method for manufacturing an electronic device, wherein an electronic device having a hole pattern or a dot pattern is manufactured utilizing the method for forming a pattern according to claim 2.

* * * * *